United States Patent [19]

Shalek

[11] Patent Number: 4,702,901

[45] Date of Patent: Oct. 27, 1987

[54] PROCESS FOR GROWING SILICON CARBIDE WHISKERS BY UNDERCOOLING

[75] Inventor: Peter D. Shalek, Los Alamos, N. Mex.

[73] Assignee: The United States of America as represented by the United States Department of Energy, Washington, D.C.

[21] Appl. No.: 839,302

[22] Filed: Mar. 12, 1986

[51] Int. Cl.$^4$ .............................................. C01B 31/86
[52] U.S. Cl. ...................................... 423/346; 423/345
[58] Field of Search ................................ 423/346, 345

[56] References Cited

U.S. PATENT DOCUMENTS

| | | | |
|---|---|---|---|
| 3,011,912 | 12/1916 | Gareis et al. | 117/106 |
| 3,053,635 | 9/1962 | Shockley | 23/208 |
| 3,161,473 | 12/1964 | Pultz | 23/208 |
| 3,230,053 | 1/1966 | Wakelyn et al. | 23/277 |
| 3,236,780 | 2/1966 | Ozarow | 252/301.4 |
| 3,246,950 | 4/1966 | Gruber | 23/208 |
| 3,275,415 | 2/1964 | Chang et al. | 23/208 |
| 3,306,705 | 2/1967 | Leineweber et al. | 23/208 |
| 3,346,414 | 10/1967 | Ellis et al. | 117/106 |
| 3,382,113 | 5/1968 | Ebert et al. | 148/175 |
| 3,391,681 | 7/1968 | Westdorp | 23/142 |
| 3,493,431 | 2/1970 | Wagner | 117/93.2 |
| 3,520,740 | 7/1970 | Addamiano | 148/175 |
| 3,546,032 | 12/1970 | Basart et al. | 148/171 |
| 3,622,272 | 11/1971 | Shyne et al. | 23/208 |
| 3,653,851 | 4/1972 | Gruber | 29/183 |
| 3,721,732 | 3/1973 | Knippenberg et al. | 423/346 |
| 3,813,340 | 5/1974 | Knippenberg et al. | 252/62.3 C |
| 3,840,647 | 10/1974 | Tomita et al. | 423/345 |
| 3,933,984 | 1/1976 | Kimura et al. | 423/345 |
| 4,013,503 | 3/1977 | Knippenberg et al. | 423/346 |
| 4,100,233 | 7/1978 | Yajima et al. | 423/345 |
| 4,349,407 | 9/1982 | Lundberg | 156/624 |
| 4,500,504 | 2/1985 | Yamamoto | 423/345 |
| 4,504,453 | 3/1985 | Tanaka et al. | 423/345 |
| 4,513,030 | 4/1985 | Milewski | 427/227 |

FOREIGN PATENT DOCUMENTS

| | | |
|---|---|---|
| 608032 | 11/1960 | Canada . |
| 922485 | 3/1973 | Canada . |
| 2042584 | 3/1971 | Fed. Rep. of Germany . |
| 2042813 | 4/1971 | Fed. Rep. of Germany . |
| 50-115197 | 9/1975 | Japan . |
| 1280506 | 7/1972 | United Kingdom . |
| 1280648 | 7/1972 | United Kingdom . |

OTHER PUBLICATIONS

Scientific American, "Macrowhisker", 64, (1985).
Yu. M. Tairov, V. F. Tsvetkov and I. I. Khlebnikov, "Growth of Silicon Carbide Crystals by Vapour-Liquid-Solid (VLS) Mechanism in the Sublimation Method," J. Cryst. Growth 20, 155–157, (1973).
Harry S. Katz et al., Handbook of Fillers and Reinforcements for Plastics (Van Nostrand Reinhold Co., New York, 1978), pp. 448–450, 464.
"Macrowhisker," Sci. Am., 64, (1985).
Kenneth M. Merz, "Crystal, Whisker and Microcrystalline Forms of Silicon Carbide," in Silicon Carbide A High Temperature Semiconductor, Proceedings of the Conference on Silicon Carbide, Boston, Mass., Apr. 2–3, 1959, (Pergamon Press, New York, 1960), pp. 73–83.
F. A. Halden, "Growth of Silicon Carbide Crystals from Solution in Molten Metal Alloys," in Silicon Carbide A High Temperature Semiconductor, Proceedings of the Conference on Silicon Carbide, Boston, Mass., Apr. 2–3, 1959, (Pergamon Press, New York, 1960), pp. 115–123.
I. Berman and C. E. Ryan, "The Growth of Silicon Carbide Needles by the Vapor-Liquid-Solid Method," J. Cryst. Growth 9, 314–318, (1971).
G. A. Bootsma, W. F. Knippenberg and G. Verspui, "Growth of SiC Whiskers in the System $SiO_2$-C-$H_2$ Nucleated by Iron," J. Cryst. Growth 11, 297–309, (1971).

Primary Examiner—John Doll
Assistant Examiner—Lori S. Freeman
Attorney, Agent, or Firm—Joseph M. Hageman; Ray G. Wilson; Judson R. Hightower

[57] ABSTRACT

A method of growing silicon carbide whiskers, especially in the $\beta$ form, using a heating schedule wherein the temperature of the atmosphere in the growth zone of a furnace is first heated to or beyond the growth temperature and then is cooled to or below the growth temperature to induce nucleation of whiskers at catalyst sites at a desired point in time which results in the selection.

9 Claims, 3 Drawing Figures

PROCESS FOR GROWING SILICON CARBIDE WHISKERS BY UNDERCOOLING

This invention is the result of a contract with the Department of Energy (Contract No. W-7405-ENG-36).

BACKGROUND OF THE INVENTION

The present invention relates generally to a method for manufacturing $\beta$ silicon carbide whiskers according to a desired heating schedule and, more particularly to a heating schedule where the furnace atmosphere temperature is raised to at least the whisker growth temperature before being cooled to or below the growth temperature for a period to induce nucleation of silicon carbide crystals at the catalyst sites at a desired point in time which results in desirable morphologies for the crystals produced.

Silicon carbide whiskers are valued for their needle-like single crystal structure which leads to such excellent properties as high strength, high elastic modules, heat resistance, chemical stability, and so on. The whiskers have been used as a composite reinforcing material for metals, plastics, and ceramics. The most desirable whiskers are $\beta$ silicon carbide single crystals which have a high length to diameter ratio.

Previous methods for growing silicon carbide whiskers have generally heated the atmosphere of a growing zone inside a furnace until the growth temperature has been reached. Temperatures could fluctuate up and down during the heating process, but no effort was made to deliberately reduce the atmosphere temperature after growth temperature was reached. In U.S. Pat. No. 4,504,453 issued to Tanaka et al., trays containing materials for growing silicon carbide whiskers were moved from one temperature zone into the next higher temperature zone of a furnace partitioned into zones with varying temperatures. The trays were then held in the temperature zones for typically an hour or two. Again, no effort was made to reduce the temperature of the growth materials after growth temperature was reached, but before the whiskers had completed growing.

In U.S. Pat. No. 3,053,635 issued to Shockley, a method for growing silicon carbide crystals from a molten metal or alloy containing silicon and carbon in solution was described. A silicon carbide seed crystal was inserted into a molten bath which was at the saturation point for silicon carbide. The seed cooled a surrounding portion of the bath causing that portion to become supersaturated and, as the seed was withdrawn from the solution, silicon carbide precipitated on the seed. However, no information was given as to how this process could be applied to a gaseous system where the silicon and carbon components were not in a molten bath.

Overall, a need still existed for a method to more quickly and precisely (in time) induce nucleation at catalyst sites. Although heating the furnace atmosphere to the growth temperature and holding thereat promoted nucleation of silicon carbide whiskers at the catalyst sites, the time needed for nucleation to occur, especially at low partial pressures of the reactants, lengthened the time the furnace had to be maintained at growth temperature, and hence increased the amount of energy needed to grow a given quantity of silicon carbide whiskers. It was necessary for the melted catalyst particles to absorb sufficient silicon and carbon after reaching the growth temperature to produce the supersaturation required for nucleation. Such supersaturation can be achieved when a catalyst composition progressively absorbs Si and C from the vapor phase, doing so isothermally at the growth temperature, until it reaches a composition where the supersaturation is great enough that nucleation will occur. Additionally, because it is difficult to regulate the isothermal approach to nucleation, unwanted whisker morphologies such as too fine or thicker bent growth may be produced in undesirable proportions. Silicon carbide whiskers with these morphologies are not suited to certain commercial uses.

SUMMARY OF THE INVENTION

The object of this invention is to provide a method for manufacturing $\beta$ silicon carbide whiskers in a shorter length of time.

A further object of this invention is to provide a method for manufacturing $\beta$ silicon carbide whiskers which requires less energy to induce nucleation for growing whiskers at the catalyst sites.

Yet another object of the present invention is to provide a method of manufacturing $\beta$ silicon carbide whiskers with more desirable morphologies and sizes.

A final object of the present invention is to better control the time and rate at which nucleation occurs to obtain desired morphologies of the crystals produced.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

To achieve the foregoing and other objects, and in accordance with the purposes of the present invention, as embodied and broadly described herein, the method of this invention may comprise a method for manufacturing $\beta$ silicon carbide whiskers which comprises heating a reaction system consisting of a silicon source, a carbon source, and a catalyst in a reducing atmosphere whereby said reaction system is first heated at least to the whisker growth tempeature and then cooling said reaction system to a temperature at or below the growth temperature to induce nucleation at catalyst sites at a desired point in time, before being held at the growth temperature for the growth period.

An advantage of the present invention is the shorter time period after a furnace has been heated to the growth temperature for inducing nucleation of silicon carbide whiskers at catalyst sites.

Another advantage of the present invention is reduction in energy required to initiate nucleation at catalyst sites of silicon carbide whiskers.

Yet another advantage of the present invention is the superior morphologies and size of the silicon carbide whiskers grown at the catalyst sites.

One other advantage of the present invention is better control of the time and the rate of nucleation by causing nucleation to occur at a certain time and rate by choosing the time and amount of cooling of the reaction system to or below the growth temperature. This in turn allows desired morphologies of the SiC whiskers to be produced.

BRIEF DESCRIPTION OF THE DRAWINGS

The accompanying drawings, which are incorporated in and form a part of the specification, illustrate the embodiment of the present invention and, together with the description, serve to explain the principles of the invention. In the drawings.

DETAILED DESCRIPTION OF THE PREFERRED EMBODIMENT

Figure 1:
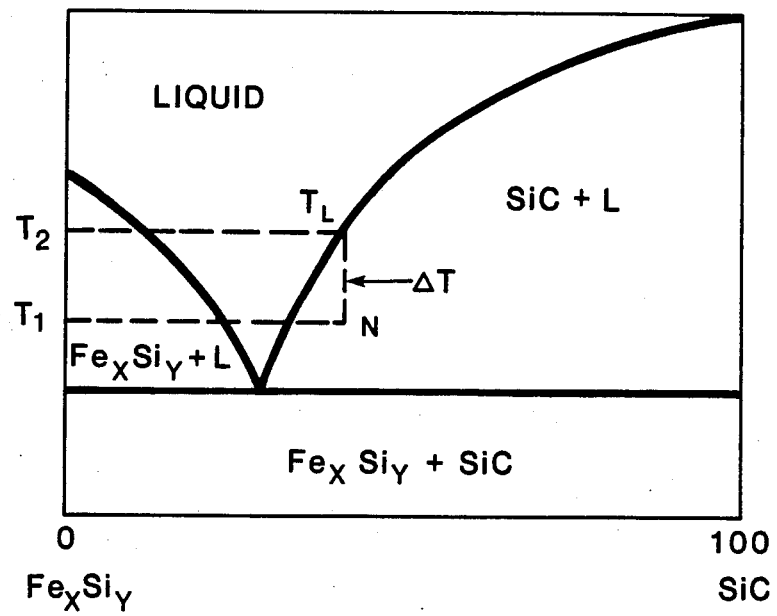
FIG. 1 is a generalized phase diagram showing the pseudobinary phase relation for the growth of SiC whiskers by a VLS (vapor-liquid-solid) mechanism.

To efficiently grow silicon carbide whiskers, especially in the β form, it is desirable to use a catalyst. After the catalyst has been applied to the growth substrate, and the growth substrate placed in a furnace, the furnace must be heated up to growth temperature. When growth temperature has been reached the catalyst particles, especially when they are metal catalyst particles, must become supersaturated with the silicon and carbon components that will go to make up silicon carbide whiskers in order to nucleate. Depending upon the initial composition of the catalyst particles, this supersaturation at growth temperature takes generally 30-150 minutes. Referring now to FIG. 1, the reason for supersaturating the catalyst particles can be illustrated. The catalyst composition absorbs silicon and carbon from the furnace atmosphere at a temperature designated $T_2$ until it reaches a liquidus composition shown at point $T_L$. The catalyst particle is then cooled (this cooling step giving the name undercooling to the invention) by an amount designated $\Delta T$ expeditiously to a temperature $T_1$ to arrive at point N, the nucleation point, on the phase diagram. At point N the catalyst particle is sufficiently supersaturated that nucleation occurs. Previous isothermal methods without undercooling are illustrated by the line at $T_1$ which arrive at point N by merely increasing the portion of silicon carbide components in the catalyst particle.

Figure 2:
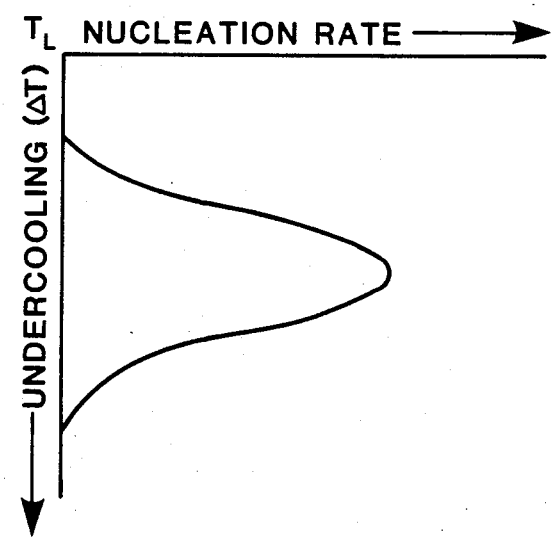
FIG. 2 is a generalized graphical depiction of the nucleation rate dependence upon temperature.

Referring now to FIG. 2, the generalized relationship between the nucleation rate and temperature is shown. As can be seen, the improvement in nucleation rate is maximized for a certain amount of undercooling. Beyond that amount of temperature reduction the nucleation rate begins to decrease from its maximum rate. The $T_L$ temperature is the equilibrium temperatue of the liquid for particular compositions of silicon, carbon, and iron where the maximum amount of silicon and carbon has been absorbed without any precipitation of silicon carbide. After the temperature is decreased, precipitation of silicon carbide takes place at the nucleation sites. By controlling the amount and the time of undercooling, the nucleation rate, as well as the precise point in time, can be selected according to the relationship shown in FIG. 2.

The furnace used to grow silicon carbide whiskers must be of a type wherein a heated atmosphere can flow through a growth zone. One such furnace is a C. I. Hayes, Inc. Model HG644. The Hayes furnace is heated by electrical resistance elements. It contains a sealed fused quartz muffle tube which allows the silicon carbide whisker growth to occur under a reducing atmosphere which is typically a hydrogen atmosphere containing lesser amounts of $N_2$, CO and $CH_4$. The actual whisker growth takes place inside a secondary box enclosure called a reactor. The furance also allows for a flow of various reactant gases through the growth zone. Typically these gases are SiO, $SiCl_4$, $SiCH_3Cl_3$, or silane.

The furnace should also have a temperature range from room temperature to 1500° C. Heating of the furnace is done automatically by a MICRICON Model 823 programmer-controller. The reactor is warmed up to or beyond the growth temperature in typically 3 to 4 hours. After the desired growth temperature has been reached or exceeded, the reactor atmosphere is cooled to or below the growth temperature. After the desired period of cooling, the reactor is brought to and maintained at the growth temperature desired. A thermocouple is placed in the center of the reactor growth zone to measure temperature. Actual control of the reactor temperature is accomplished indirectly from a thermocouple on the outside of the muffle tube.

Substrates are placed in the growth zone of the reactor to serve as a basis for whisker growth. Typically these growth plates are made of graphite. Before being placed into the furnace, catalyst particles are placed upon the growth plates. One advantage of using graphite plates as the growth substrates is that while the catalyst particles are still in contact with the graphite they can absorb carbon from the plates after melting. Of course this absorption is cut off when the growing whiskers lift the catalyst particles, which are now melted into a molten ball at the end of growing whiskers, away from the graphite substrates. Afterwards, the carbon source for the catalyst balls must be the gas mixture flowing through the growth zone. Therefore, the flowing atmosphere must contain a carbon source such as methane or a carbon atom in another more complicated gas. The silicon source for the catalyst ball may be a silicon-containing gas or a $SiO_2$/C powder mixture.

The catalyst particles placed upon the growth plates to serve as nucleation sites for the beginning of whisker growth are typically metal particles. These metal particles may be comprised of one or more of the following metals: manganese, cobalt, nickel, iron, chromium, and silicon. These catalyst particles are available from many sources. For instance, stainless steel flakes are available from Novamet Company of Wykoff, N.J. Flaked ferrosilicon can be obtained from many sources and should have an approximate particle size of 17 μm and a silicon content of approximately 22 weight percent. Another typical catalyst particle is composed of the substance designated as Alloy 62 which has the following weight percent composition: Mn 65, Co 14, Ni 20, Si 0.25, Fe 0.1, Cr 0.2, B 0.25, Zn 0.25; and is available from Metallurgical Technology in Winslow, N.J. The two most common methods for depositing the catalyst particles upon the substrate are painting and spraying. For both methods it is necessary to suspend the catalyst particles in some type of solution. For painting, i.e., applying the catalyst particle suspension with a brush, a typical suspension vehicle is made of a weight of Cabosil ®, which is a product of the Cabot Corporation, Boston, Mass., equal to about half the 4.5 parts by weight of catalyst particles which is then further mixed with 50 parts each of a liquid acrylic resin in methyl ethyl ketone. Similar suspension media are available for spraying.

Figure 3:
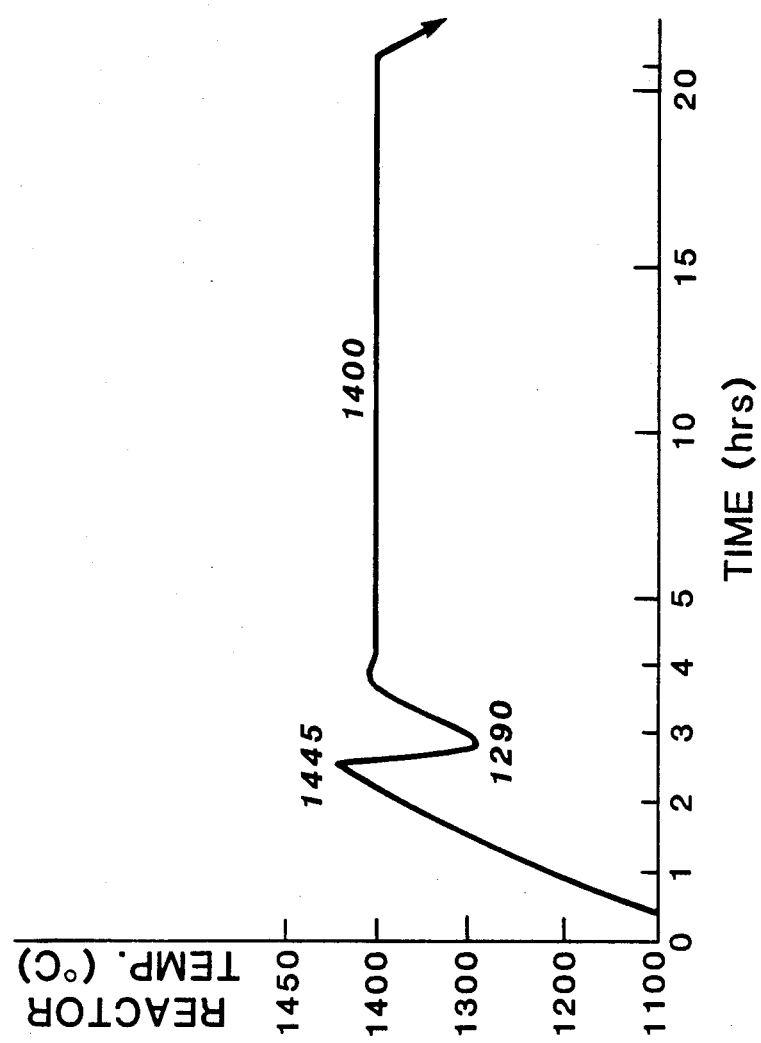
FIG. 3 shows a time-temperature diagram for the atmosphere in the reactor growth zone of Example 1.

Referring now to FIG. 3, a typical time-temperature profile for the temperature within the growth zone of a furnace, it is necessary to heat the atmosphere in the growth zone to the growth temperature. Growth temperatures for the manufacture of silicon carbide whiskers, especially in the β form, typically are around 1400° C. but can vary from 1350° to 1500° C. Typically, to reach these growth temperatures takes 3-4 hours. Once the maximum temperature has been reached, which can be from zero to 100° C. beyond the growth temperature, it is necessary to let the atmosphere temperature in the growth zone cool. This process, previously called undercooling, allows the temperature to fall to or below the growth temperature. Typically the undercooling is no more than 150° C. when the growth temperature has not been exceeded during the heating up of the furnace. However, where the growth temperature has been exceeded by 100°, undercooling may bring the temperature back down 250° C. to provide a temperature 150° below the growth temperature. After the minimum temperature has been reached during the undercooling period, the atmosphere in the growth zone is returned to the growth temperature. Throughout this time period, both during the heating up of the atmosphere temperature up to and beyond the growth temperature and during the undercooling, the silicon carbide growth gases are flowing through the growth zone.

After returning to the growth temperature following the undercooling period, the silicon carbide growth gases continue to flow throughout the entire growth period. This typically lasts for 8-18 hours. The furnace is then cooled to 1000° C. in 3-4 hours and the reactor removed from the furnace and allowed to cool. At room temperature, the silicon carbide whiskers grown are removed by careful scraping.

EXAMPLE 1

The C. I. Hayes, Inc. furnace Model HG644, previously described, was fitted with a 5-plate production type reactor whose box dimensions were 19 in. (48.3 cm) by 5.5 in. (14 cm) by 5.5 in. (14 cm). The growth surface was brushed with Alloy 62 suspended in a vehicle of Cabosil ® and liquid acrylic resin. A gas mixture, flowing through the furnace at a rate of 41.5 l/min, was composed of the following volume percentage: $H_2$ - 86.7, $N_2$ - 7.9, CO - 5.1, $CH_4$ - 0.28, and SiO - 0.10 which were normalized over a 12 hour period. The firing cycle for the furnace is illustrated in FIG. 3 when undercooling was initiated at 2.5 hours when the temperature was 1445° C. The temperature of the furnace fell to 1290° C. before being returned to the growth temperature of 1400° C. The furnace temperature was allowed to fall after 21 hours and whisker growth ceased. Undercooling allowed precise control over the beginning of nucleation and produced 14.4 g of long, uniform, smooth green SiC whiskers of from 3 to 10 μm in diameter. The whiskers produced were characterized as being in the 4 to 5 A category acording to a table shown on the page 1164 of the article John V. Milewski et al., "Growth of Beta-Silicon Carbide Whiskers by the VLS Process," J. Materials Science 20, 1160–1166 (1985).

The foregoing description of the preferred embodiments of the invention has been presented for purposes of illustration and description. It is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method of manufacturing β silicon carbide whiskers which comprises heating a reaction system consisting of a silicon source, a carbon source, and a catalyst in a reducing atmosphere whereby said reaction system is first heated beyond the whisker growth temperature and then said reaction system is cooled to a temperature to or below the growth temperature to induce nucleation at catalyst sites at a desired point in time, before being held at the growth temperature for the growth period.

2. The method of claim 1 wherein said growth temperature is from 1350° to 1500° C.

3. The method of claim 1 wherein said reducing atmosphere is a hydrogen atmosphere.

4. The method of claim 1 wherein said carbon source before whisker growth includes a graphite substrate.

5. The method of claim 1 wherein said silicon source is a $SiO_2$ and carbon powder mixture.

6. The method of claim 1 wherein said catalyst comprises one or more of the following metals: manganese, cobalt, nickel, iron, chromium, and silicon.

7. The method of claim 1 wherein said reaction system is cooled 150° C. below the growth temperature, before the growth period.

8. The method of claim 1 wherein said reaction system is heated up to 100° C. beyond the growth temperature before the growth period.

9. The method of claim 1 wherein said β silicon carbide whiskers are grown by the vapor-liquid-solid mechanism.

* * * * *